United States Patent [19]

Takegahara et al.

[11] Patent Number: 5,127,022

[45] Date of Patent: Jun. 30, 1992

[54] DIFFERENTIAL CODING SYSTEM

[75] Inventors: Toshiyuki Takegahara; Satoru Koizumi; Yoshiharu Hoshino; Hideki Suganami; Kozo Kameda; Takeshi Kimura; Yoshimichi Otsuka, all of Tokyo, Japan

[73] Assignee: Nippon Hoso Kyokai, Tokyo, Japan

[21] Appl. No.: 439,815

[22] Filed: Nov. 21, 1989

[51] Int. Cl.⁵ .............................................. H04B 14/06
[52] U.S. Cl. ......................................... 375/27; 358/135; 341/76
[58] Field of Search ........................ 375/37, 53, 56, 84, 375/27; 332/103; 455/110; 358/135; 341/76

[56] References Cited

U.S. PATENT DOCUMENTS

| | | | |
|---|---|---|---|
| 3,924,186 | 12/1975 | Gordy et al. | 375/56 |
| 4,092,491 | 5/1978 | Frazer | 375/56 |
| 4,109,101 | 8/1978 | Mitani | 375/53 |
| 4,481,640 | 11/1984 | Chow et al. | 375/84 |
| 4,523,323 | 6/1985 | Nakajima et al. | 375/37 |

FOREIGN PATENT DOCUMENTS 63-16718  1/1988  Japan .

Primary Examiner—Stephen Chin
Attorney, Agent, or Firm—Stevens, Davis, Miller & Mosher

[57] ABSTRACT

A differential code (DPCM) transmission system for an audio signal, in case higher frequency components thereof are dominant, every another samples of the input signal are alternately into two groups, in each of which differential coding effected, so as to maintain a dynamic range in higher frequency range; when a near instantaneously compressed DPCM signal is transmitted, coding errors caused by the compression are corrected by varying the difference between samples in response to the comparison between a locally decoded signal and the original signal; when the frequency components exceeding one fourth of the sampling frequency are contained in the input signal, successive 3 MSB's having a pattern "1, 0, 1" or "0, 1, 0" are corrected into "1, 1, 1" or "0, 0, 0" respectively; and in case 2 symbols of a tertiary code converted from 3 bits of a binary code are transmitted and restored, peripheral bit arrangement of a matrix having rows consisting of the first symbols of the converted tertiary codes and columns consisting of the second symbols thereof are allotted such as Gray codes are obtained, while an inner 2×2 matrix of a 4×4 matrix formed by inserting a new threshold level between two threshold levels provided for detecting the tertiary code is allocated with bits relating to bits arranged at adjacent positions, so as to reduce the bit error rate of the restored binary code.

6 Claims, 16 Drawing Sheets

FIG_1a
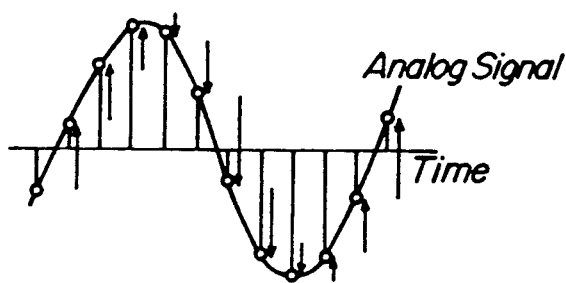
FIG_1b
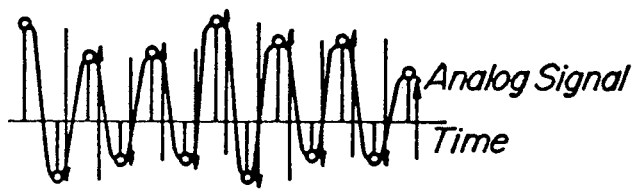
FIG_1c
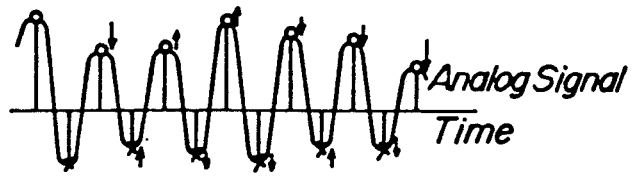

FIG_2a
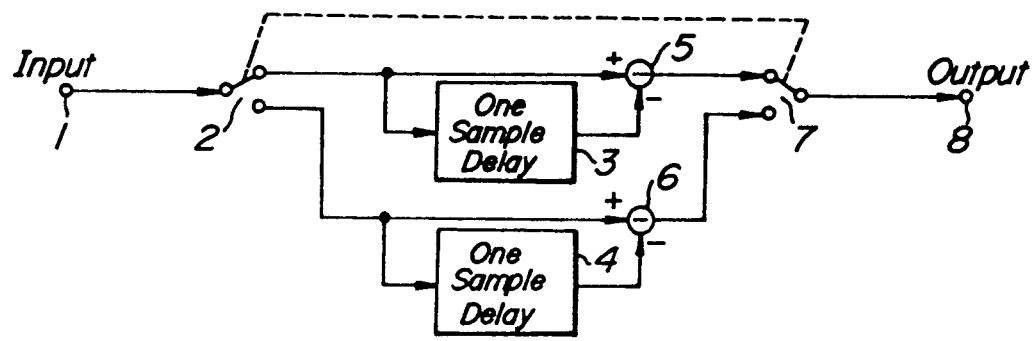
FIG_2b
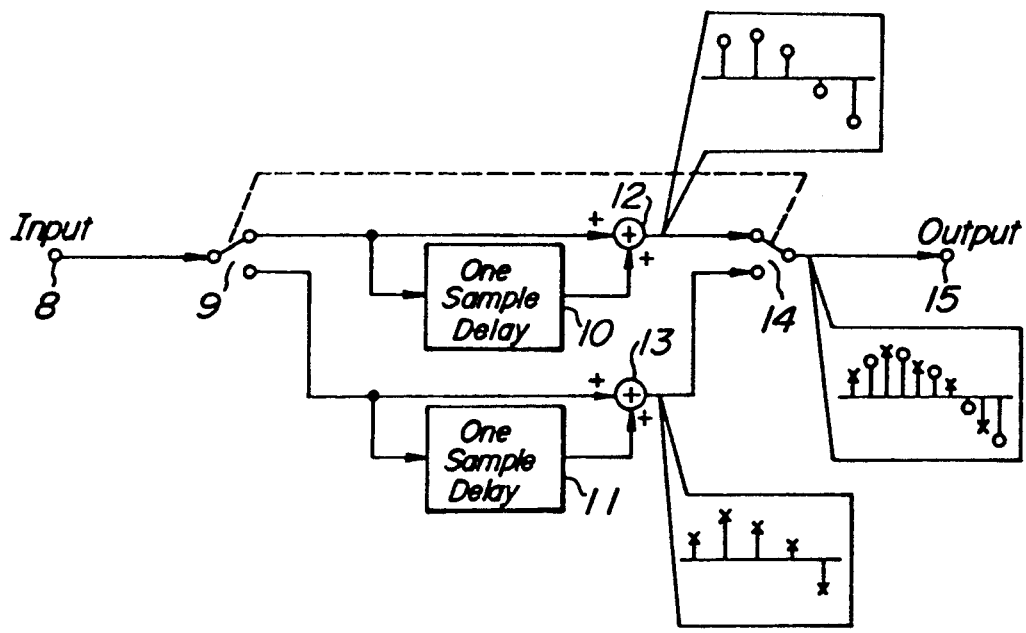

FIG_3
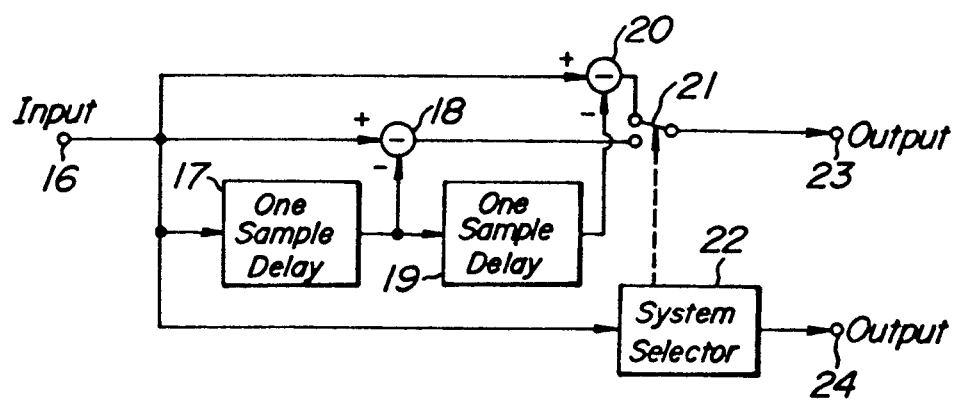

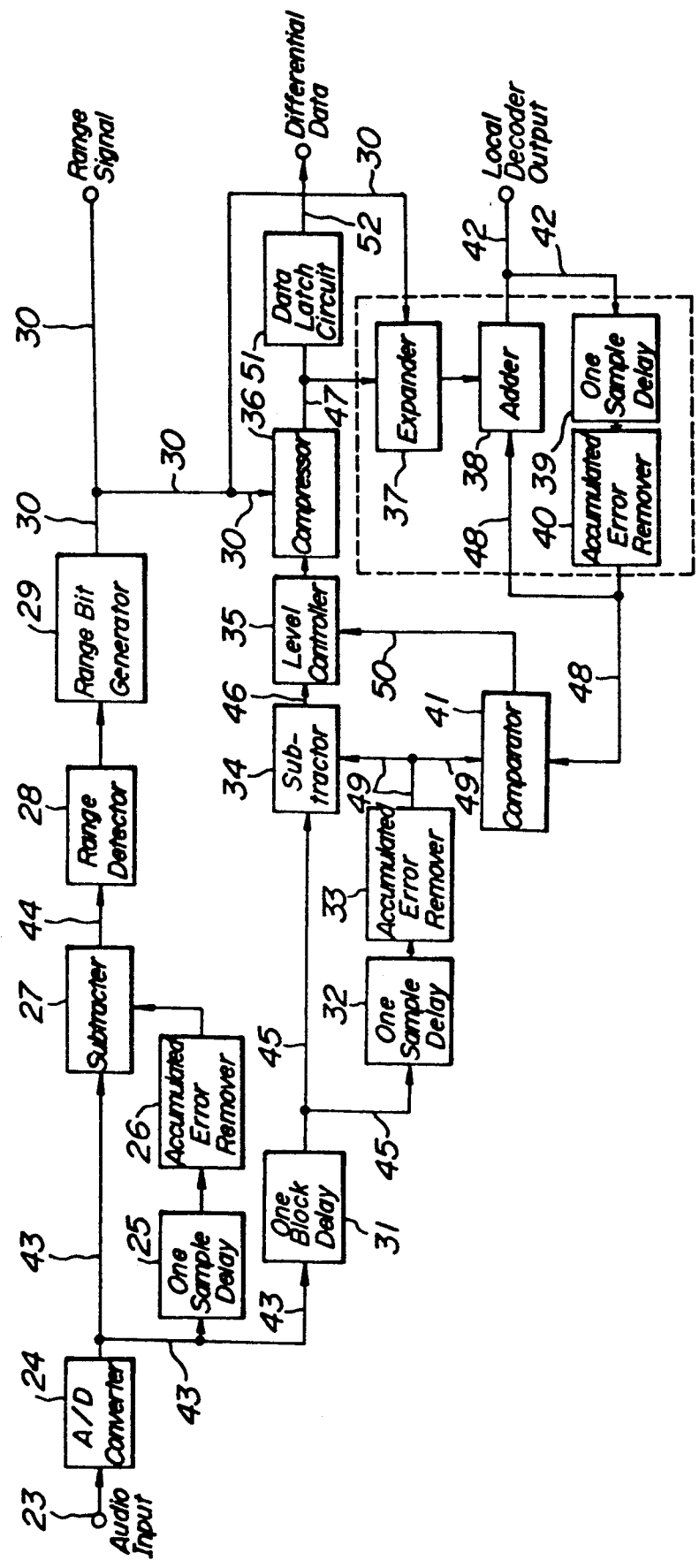
FIG._4

FIG_6

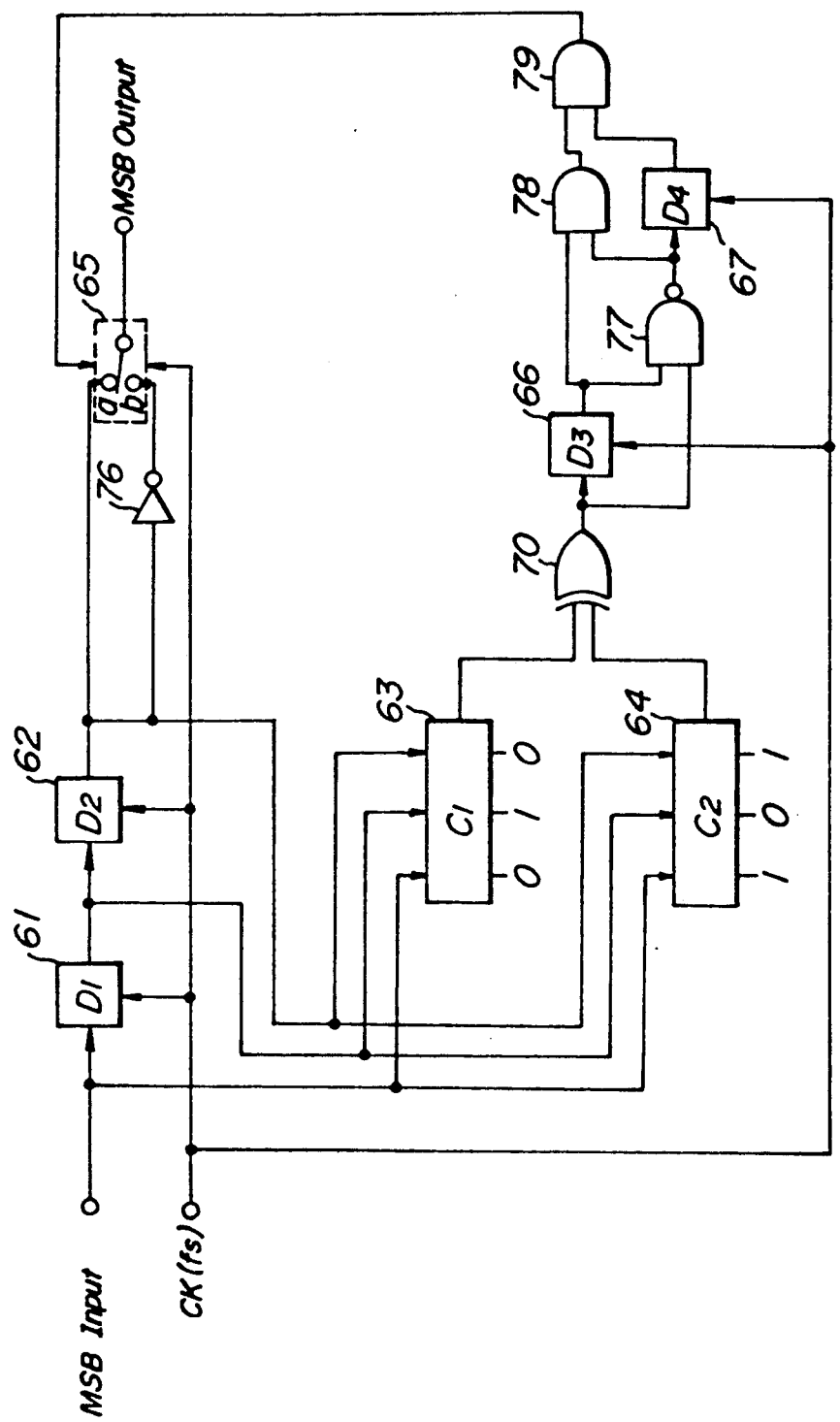
FIG_8

FIG_10

| First Symbol / Second Symbol | L0 | L1 | L2 |
|---|---|---|---|
| L0 | 000 | 001 | 010 |
| L1 | 111 |  | 011 |
| L2 | 110 | 101 | 100 |

FIG_11

| Second Symbol \ First Symbol | Threshold | L0 | L1 | L2 |
|---|---|---|---|---|
| | | | I ↓ | II ↓ |
| L0 | | 000 | 001 | 011 |
| L1 | I → | 100 | | 010 |
| L2 | II → | 101 | 111 | 110 |

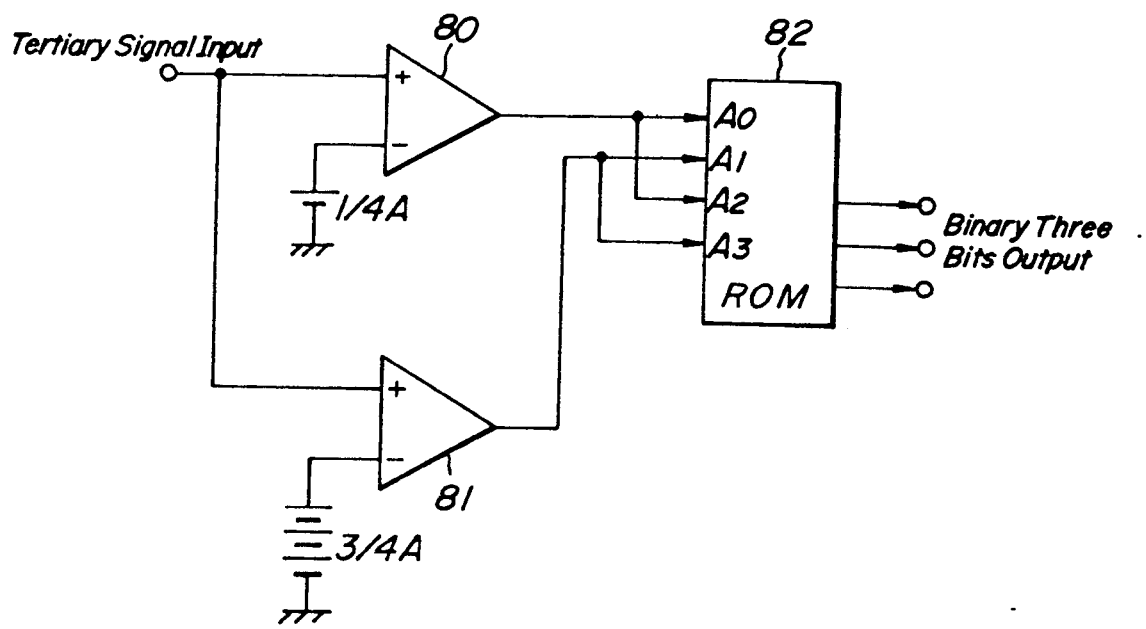
FIG._12
PRIOR ART

FIG. 13

| Second Symbol | First Symbol / Threshold | L0 | L1 | | L2 |
|---|---|---|---|---|---|
| | | | I ↓ | II ↓    III ↓ | |
| L0 | | 0 0 0 | 0 0 1 | 0 0 1 | 0 1 1 |
| L1 | I → | 1 0 0 | 0 0 0 | 0 1 1 | 0 1 0 |
| | II → | 1 0 0 | 1 0 1 | 1 1 0 | 0 1 0 |
| | III → | | | | |
| L2 | | 1 0 1 | 1 1 1 | 1 1 1 | 1 1 0 |

FIG_14

| Second Symbol \ First Symbol | Threshold | L1 | |
|---|---|---|---|
| | | | II ↓ |
| L1 | II → | 0 0 0<br>0 0 1<br>1 0 1<br>1 0 1 | 0 0 0<br>0 0 1<br>0 1 0<br>0 1 1 |
| | | 1 0 0<br>1 0 1<br>1 1 0<br>1 1 1 | 0 1 0<br>0 1 1<br>1 1 0<br>1 1 1 |

FIG_15

| | First Symbol | L0 | L1 | L2 |
|---|---|---|---|---|
| Second Symbol | Threshold | I↓ II↓ III↓ | | |
| L0 | | 000 | 001 \| 001 | 011 |
| L1 | I→ | 100 | 001 \| 001 | 010 |
| | II→ III→ | 100 | 111 \| 111 | 010 |
| L2 | | 101 | 111 \| 111 | 110 |

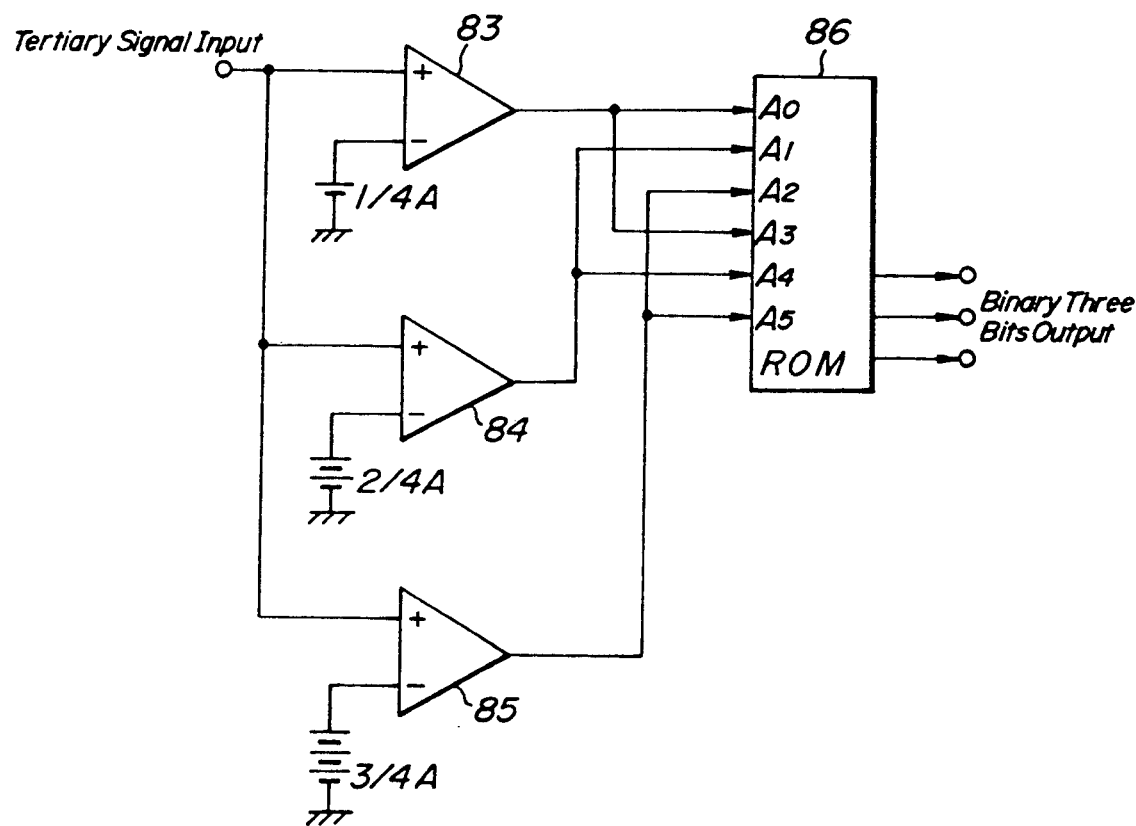
FIG_16

DIFFERENTIAL CODING SYSTEM

BACKGROUND OF THE INVENTION

1. Field of the Invention (A1) The present invention relates to a differential code transmission system, more particularly, different from the conventional system of this kind, such that samples of an input analog signal such as an audio signal are separated, for instance, every other one into two groups of odd numbers and even numbers, in each of these two groups respectively, successive differences of samples being coded, so as to be transmitted or recorded.

(B1) Moreover, it relates to a system of this kind, more particularly, successive differences of samples being near instantaneously compressed, so as to be accurately transmitted.

(C1) Furthermore, it relates to a system of this kind, more particularly, correctable without any correction code added, even if errors are caused during the transmission or the recording.

(D1) Generally, it relates to a system of this kind, more particularly, to the code transmission effected through the code conversion from 3 bits of a binary code to 2 symbols of a tertiary code, with a bit error rate reduced.

2. Related Art Statement (A2) According to the conventional differential code transmission system, in a differential coding apparatus, continuously successive samples of an input analog signal are coded and then transmitted or recorded. So that, the higher the frequency of the signal is raised, the narrower the dynamic range of the apparatus is reduced, and hence the distortion of the coded signal having ample components in the higher frequency range is extremely increased as the case may be. This situation may be readily understood by referring to FIGS. 1a and 1b showing the relations between the frequency and the amplitude of differential components of the signal in comparison between the case as shown in FIG. 1a that the conventional differential PCM coding is applied on the low frequency signal and the other case as shown in FIG. 1b that it is applied on the high frequency signal. In this connection, throughout FIGS. 1a and 1b, a segmental line capped with a circular mark indicates a uniformly quantized signal, while another segmental line capped with an arrow indicates a differential component obtained by the conventional coding system.

(B2) Moreover, as for the conventional technique, an error correction effected by using a local decoder is frequently carried out in the conventional differential PCM coding apparatus, while no differential coding apparatus effecting near instantaneous compression and expansion has not yet disclosed. As a documental example concerned, "PCM Transmission System" edited by the Japanese Eelctronication Society, 1974, pp.242 relating to the differential PCM apparatus for transmitting the picture signal can be found.

On the other hand, Japanese Patent Laid-open Publication No. 63-16,718, "Near Instantaneous Compression Coding System" written by the present inventors discloses a near instantaneous compression coding system in which successive differences between adjacent samples of an input analog signal are applied with near instantaneous compression through a range compressor controlled by a range signal indicating a range compression factor set up in each of predetermined sections dividing successive samples of the input analog signal in response to the maximum value of the difference between successive samples in each of the sections and thereafter an output of the range compressor is transmitted together with the range signal concerned, featured in that the difference of successive samples is obtained between an immediately preceding sample derived from a local decoder provided on a sending side and a present sample, while an error caused by the range compression in the signal to be transmitted is corrected through a feedback arrangement.

In addition, in the conventional differential PCM transmission system, the difference between successive samples in the lower frequency range is small and hence can be transmitted with a smaller number of bit, while the difference between successive samples in the higher frequency range becomes large, so that the reduction of transmitted bits cannot be attained by the differential coding.

In connection with the above, the transmission efficiency has been conventionally increased by compressing the differential signal on the sending side, while by expanding it on the receiving side. However, it is impossible to neglect the received signal distortion based on the errors caused in the lower frequency range by the reduction of the number of transmitted bits which is based on the above compression of the differential signal to be transmitted.

The aforesaid near instantaneous compression coding system disclosed in the Japanese laid-open publication has been conceived, so as to prevent the above defect of the reduction of the number of transmitted bits by effecting the above described error correction in the near instantaneous compression and expansion. However, even this near instantaneous compression coding system is not yet sufficient.

(C2) Furthermore, the most significant bit of the differential coding (DPCM) signal contains an information corresponding to the sign indicating the positive (increasing) and the negative (decreasing) differential coefficient of the original analog signal at the sample point, unlike that of the linear pulse coding (PCM) signal at the sample point thereof. However, any conventional technique for utilizing this information contained in the MSB as for the erroneous code correction has not yet disclosed.

In addition, the DPCM signal has a peculiar property such that an error once caused during the transmission or the recording is propagated to consecutive coded signals, unlike the linear PCM signal. More particularly, the MSB signal indicates the increase or the decrease of the difference between successive samples, so that the erroneous MSB signal has a serious influence upon the decoded signal. For avoiding this serious influence, it may be conceivable to apply an intense correction code particularly upon the MSB signal. However, it is frequently inappropriate in case that the capacity for the recording or the transmission is limited.

(D2) Generally, in the transmission of the binary code, it is frequently required for restricting the frequency band width of the transmitted signal to convert the binary code into a certain multi-level code. However, the employment of the multi-level code inevitably complies the reduction of threshold levels for discriminating the received multi-level codes and hence the code error of the multi-level code received through a noisy transmission path is frequently caused by the noise. As a result, in the counter conversion of the multi-level code into the binary code, the extent of bit error caused in the converted binary code is varied in response to the coding method employed.

SUMMARY OF THE INVENTION (A3) An object of the present invention is to remove the conventional defect as described in paragraphs (A2) and hence to provide a differential code transmission system having an improved transmission efficiency such that a sufficiently wide dynamic range can be maintained even for an input analog signal having frequency components concentrated in the higher frequency range through a comparatively simple circuit arrangement.

For attaining the above object, the differential code transmission system according to the present invention is featured in that samples of an input analog signal are separated every other one into two groups of odd numbers and even numbers, in each of said two groups respectively, successive differences of samples being differentially coded, so as to be transmitted or recorded.

The differential code transmission system according to the present invention is further featured in that a first differential code transmitting means in which samples of the input analog signal are separated into two groups and a second differential code transmitting means in which those samples are not separated are provided and switched over to each other in response to the detected output of higher frequency components of the input analog signal, so as to individually effect the code transmission.

The differential code transmission system according to the present invention is still further featured in that, the successive differences of the samples of the input analog signal are applied with a near instantaneous compression.

(B3) Another object of the present invention is to remove the conventional defect as described in paragraphs (B2) and hence to provide a differential code transmission system, in which, in addition to the feedback arrangement employed similarly as disclosed in the aforesaid Japanese patent laid-open publication, a level of a differential output signal obtained by the comparison between an output signal of the local decoder and the original input signal is appropriately controlled, so as to always correct the error of the code transmission for improving the disclosure of the above laid-open publication.

For attaining the above object, the differential code transmission system according to the present invention is featured in that, for the near instantaneous compression coding in which successive differences between adjacent samples of an input analog signal are applied with near instantaneous compression through a range compressor controlled by a range signal indicating a range compression factor set up in each of predetermined sections dividing successive samples of the input analog signal in response to the maximum value of the difference between successive samples in each of the sections, and thereafter, an output signal of the range compressor is transmitted together with the range signal concerned, the sample restored from the output signal of the range compressor through a local decoder provided on a sending side and the sample of the input analog signal are compared with each other, and, in response to a result of the comparison of the samples, a gain of a subtracter provided for obtaining the successive differences between samples is feedback-controlled, whereby errors of the successive differences between samples, which are caused through the near instantaneous compression, are corrected.

(C3) Further another object of the present invention is to remove the conventional defect as described in paragraphs (C2) and hence to provide a differential code transmission system in which, under the utilization of an information contained by the MSB of the DPCM signal, an error caused in the received or the reproduced DPCM signal can be readily detected and corrected by detecting an error of the MSB without the addition of any new correction code.

For attaining the above object, the differential code transmission system according to the present invention is featured in that, as for a sampling frequency $f_s$, a means for discriminating whether a signal component of a frequency exceeding $f_s/4$ is contained in the input analog signal or not is provided, and, only when the fact that the signal component of the frequency exceeding $f_s/4$ is not contained in the input analog signal is confirmed by the means concerned, a pattern of "1, 0, 1" and/or "0, 1, 0" arranged by successive three most significant bits of the differential coded signal to be decoded are corrected into "1, 1, 1" and/or "0, 0, 0" respectively.

(D3) Still further another object of the present invention is to remove the conventional defect as described in paragraphs (D2) and hence to provide a code transmission system in which a bit error rate of a received tertiary code is significantly reduced.

For attaining the above object, the code transmission system according to the present invention, in which successive 3 bits of a binary code are converted into 2 symbols of a tertiary code, is featured in that, on a sending side,
successive 3 bits of the binary code are allotted such as a peripheral code arrangement of a matrix of 3 rows and 3 columns, a row of which consists of the first symbol of the tertiary code, while a column of which consists of the second symbol thereof, corresponds to a Gray code, and, on a receiving side,
3 steps of threshold level are provided for decoding the tertiary code.

Further, a code transmitter according to the present invention, in which successive 3 bits of a binary code are converted into 2 symbols of a tertiary code, is featured by comprising a coding means arranged such that successive 3 bits of the binary code are allotted such as a peripheral code arrangement of a matrix of 3 rows and 3 columns, a row of which consists of the first symbol of the tertiary code, while a column of which consists of the second symbol thereof, corresponds to a Gray code.

Still further, a code receiver according to the present invention is featured by comprising
a receiving means for receiving the tertiary code, 2 symbols of which are converted from successive 3 bits of a binary code such that successive 3 bits of the binary code are allotted such as peripheral code arrangement of a matrix of 3 rows and 3 columns, a row of which consists of the first symbol of the tertiary code, while a column of which consists of the second symbol thereof, and
a decoding means arranged such that another matrix of 2 rows and 2 columns, which is disposed at a central portion of a still another matrix of 4 rows and 4 columns formed by providing 3 steps of threshold level corresponding to respective levels of the tertiary code received and detected by the receiving means concerned, is allotted with bits which respectively relate to bits arranged at positions adjacent the other matrix concerned.

BRIEF DESCRIPTION OF THE DRAWINGS

For a better understanding of the invention, reference is made to the accompanying drawings, in which:

(A4) FIGS. 1a, 1b and 1c are diagrams showing respectively examples of amplitudes of differential signals corresponding to frequency ranges of an input signal as described before;

FIGS. 2a and 2b are block diagrams showing outlined structures of a coder and a decoder of an embodiment of a differential code transmission system according to the present invention;

FIG. 3 is a block diagram showing an outlined structure of the coder of another embodiment of the same;

(B4) FIGS. 4 and 5 are block diagrams showing preferred embodiments on a sending side and a receiving side of the same respectively;

FIG. 8 is a block diagram of a preferred embodiment of the same;

FIGS. 10 and 11 are diagrams showing the principle of code conversion according to the present invention respectively;

FIG. 12 is a block diagram showing a conventional structure of a decoder for a converted tertiary code;

FIGS. 13 to 15 showing diagrams showing examples of the decoding process according to the present invention respectively; and FIG. 16 is a block diagram showing an embodiment of a decoder for the converted tertiary code according to the present invention.

Figure 5:
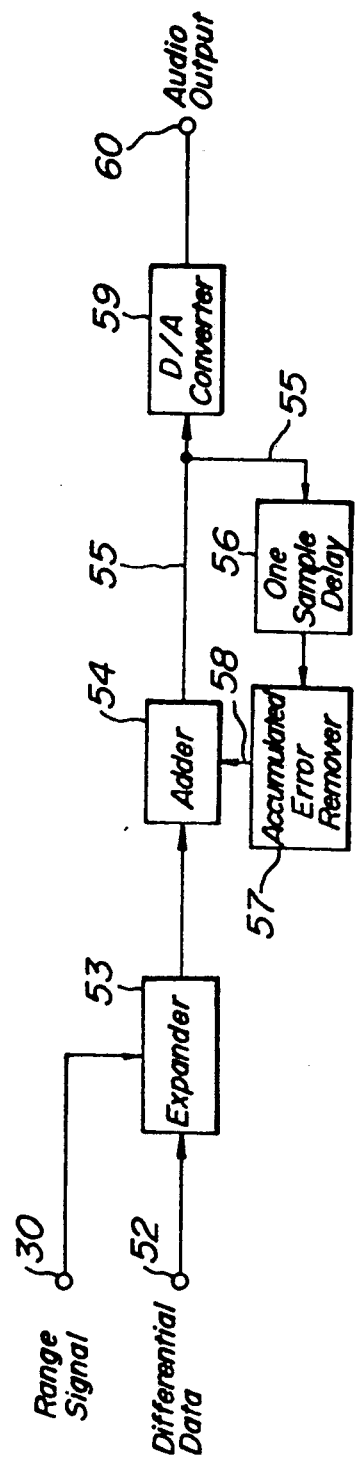

Throughout different views of the drawings,
(A5)1,8,16 . . . input terminal
2,7,9,14,21 . . . changeover switch
3,4,10,11,17,19 . . . one sample delay
5,6,18,20 . . . subtracter
12,13 . . . adder
22 . . . system selector
(B5) 23 . . . input terminal
24 . . . A/D converter
25,32,39,56 . . . one sample delay
26,33,40,57 . . . accumulated error remover
27,34 . . . subtracter
28 . . . range detector
29 . . . range bit generator
30 . . . range signal
31 . . . one block delay
35 . . . level controller
36 . . . compressor
37,53 . . . expander
38,54 . . . adder
41 . . . comparator
42 . . . local decoder output signal
43,55 . . . digital signal
44,46 . . . digital differential signal
45 . . . input delayed signal
47 . . . differential compressed signal
48 . . . decoded delayed signal
49,58 . . . one sample delayed signal
50 . . . error output
51 . . . data latch circuit
52 . . . differential data
53 . . . expander
59 . . . D/A converter
60 . . . output terminal
(C5)61,62,66,67 . . . one sample delay
63,64 . . . 3 bit comparator
65,68 . . . switch
69 . . . frequency information or frequency component detection circuit
70 . . . OR gate
71 . . . analog signal
72 . . . sample point
73 . . . error pattern
74,75 . . . error bit
76 . . . inverter
77 . . . NAND gate
78,79 . . . AND gate
(D5)80,81,83,84,85 . . . comparator
82,86 . . . read only memory

DESCRIPTION OF THE PREFERRED EMBODIMENTS

The present invention will be described in detail by referring to the drawings hereinafter.

(A6) FIGS. 2a and 2b show outlined structures of a coder and a decoder required for effecting the differential coding of the system according to the present invention as featured in paragraphs (A3), respectively.

In the coder as shown in FIG. 2a, uniformly quantized samples of an input analog signal are supplied at an input 1 and then every other one of those samples are separated into two groups of odd numbers and even numbers.

In each of these two groups separated by a changeover switch 2, differences of successive samples in each of these two groups are obtained through respective combinations of one sample delays 3 and 4 and subtracter 5 and 6 and alternately derived from an output 8 through another changeover switch 7 which is interlocked with the switch 2, as a differential output signal to be coded.

In the decoder as shown in FIG. 2b, the differential signal, which is coded by the above coder and then obtained through a transmission line or a recording and reproducing system, is supplied at an input 8, so as to be decoded. Thus obtained differential samples are separated again into two groups of odd numbers and even numbers through a changeover switch 9. Successive differential samples in each of these two groups are successively added to previously obtained immediately preceding samples through respective combinations of one sample delays 10 and 11 and adder 12 and 13 and alternately derived from an output 15 through another changeover switch 14, which is interlocked with the switch 9, as restored uniformly quantized samples.

FIG. 3 shows an example of the coder which jointly employs a conventional differential coder of non-separation system and the aforesaid differential coder of separation system according to the present invention. In the exemplified structure as shown in FIG. 3, a combination of one sample delays 17 and 19 and a subtracter 20 belongs to the separated differential coding system, while another combination of the one sample delay 17 and another subtracter 18 belongs to the non-separated differential coding system. These two kinds of differential coding systems are selectively used under the control of a system selector 22 which is supplied with an input successive samples and selects either one of these two kinds of systems, in response to the contents of the input signals such as frequency components thereof, through a changeover switch 21, so as to more efficiently utilize the selected system. The switched signal is derived from an output 23, so as to be differentially coded, while information required for decoding as to which system has been selected is derived from the system selector 22 through another output 24.

The examples of the relationship between the frequency and the amplitude of differential components of the signal in the conventional differential coding system have been shown in FIGS. 1a and 1b, while the same in the separated differential coding system of the present invention is shown in FIG. 1c, so as to attain a better understanding of the improvement of transmission efficiency according to the invention in comparison with that of the conventional system. In FIG. 1c, a segmental line capped with a circular mark indicates an odd number sample of a uniformly quantized signal, another segmental line capped with an oblique cross mark indicating an even number sample of the same, while further another segmental line capped with an arrow mark indicates a sample of a differential signal of the coding system according to the present invention.

Next, a case that the separated differential coding system according to the present invention is applied on the conventional near instantaneous compression differential coding system will be described hereinafter. In this connection, the near instantaneous compression differential coding system is featured in that successive differences between adjacent samples of an input analog signal are applied with near instantaneous compression through a range compressor controlled by a range signal indicating a range compression factor set up in each of predetermined sections dividing successive samples of the input analog signal in response to the maximum value of the difference between successive samples in each of the sections and thereafter an output of the range compressor is transmitted together with the range signal concerned, while the difference between successive samples is obtained from a difference between an immediately preceding sample restored through the near instantaneous compressor, a near instantaneous expander and an accumulator, as described in detail in the aforesaid Japanese laid-open publication, and hence the application thereof on the separated differential coding system is substantially the same as that applied on the conventional differential coding system, so that the detailed description relating thereto will be omitted.

(B6) Next, FIGS. 4 and 5 show examples of detailed structures of a sending side and a receiving side of a correction type near instantaneous compression differential coding system having the features as described in paragraphs (B3) respectively. On the sending side as shown in FIG. 4, an input analog signal supplied at an input 23 is sampled at an appropriate sampling frequency and then converted into a uniformly quantized digital signal 43 through an A/D converter 24. From thus converted digital signal 43, digital differential signals 44 between adjacent two samples are obtained time sequentially through a combination of a one sample delay 25, an accumulated error remover 26 and a subtracter 27 and are supplied to a range detector 28. In this connection, the accumulated error remover 26 is originally used for reducing the prediction error in the prediction coding and for improving the compression efficiency thereof. However, it is used in the present case for reducing the tone quality deterioration caused by the coding error in the transmission.

In the range detector 28, signal levels of successive differential signals are individually detected in each of predetermined sections thereof and hence respective compression ranges of differential signals in each of those sections are determined in response to the maximum of the detected signal levels individually. In this connection, the time duration of each of those sections is set up, for instance, to that corresponding to 32 samples in case the input analog signal is sampled at a sampling frequency of 32 kHz.

The maximum signal level detected through the range detector 28 and the range signal, which is derived from a range bit generator 29 for indicating the compression range as determined above, are maintained during the immediately succeeding section.

On the other hand, the digital signal 43 derived from the A/D converter 24 is delayed by one section through a one block delay 31, so as to obtain a delayed input signal 45. This delayed input signal 45 is converted into a digital differential signal 46 through another combination of a one sample delay 32, an accumulated error remover 33 and a subtracter 34, the digital differential signal 46 being supplied to a level controller 35.

Then, the digital differential signal 46 effected by the level control as described later is near instantaneously compressed through a compressor 36 in response to the aforesaid range signal 30 derived from the range bit generator 29, so as to obtain a compressed differential signal 47. This compressed differential signal 47 is immediately expanded into the original state through an expander 37 controlled by the same range signal 30, the expander 37 comprising a local decoder as shown with a surrounding broken line in FIG. 4 together with a combination of an adder 38, a one sample delay 39 and an accumulated error remover 40, so as to obtain a locally decoded output 42. A decoded delayed signal 48 derived from the accumulated error remover 40 should be originally the same to the one sample delayed signal 49 derived from the accumulated error remover 33, so that an error output 50 can be obtained through a comparator 41 for comparing these two kinds of delayed signals 48 and 49 with each other.

In the aforesaid level controller 35, the level of the digital differential signal 46 derived from the subtracter 34 is controlled so as to converge the error output 50 to zero. In this connection, a loop circuit consisting of the level controller 35, the compressor 36, the local decoder as indicated by the surrounding broken line and the comparator 41 is independent of the remaining coder circuit proper, so that it is possible to operate this independent loop circuit under the control of a clock system which is faster than the sampling clock used for the coder proper, and hence it is possible also that the digital differential signal 46 is corrected so as to be brought more close to the true value prior to the appearance of the next sample.

Thus, a sufficiently corrected differential compressed signal 47 can be derived from a data latch circuit 51 as a differential data 52 at the sampling period.

Next, on the receiving side as shown in FIG. 5, the transmitted differential data 52 is expanded through an expander 53 controlled by the together transmitted range signal 30 and then is successively restored into the original digital signal 55 through another combination of an adder 54, a one sample delay 56 and an accumulated error remover 57, so as to derive an analog audio output 60 through a D/A converter 59.

Figure 6:
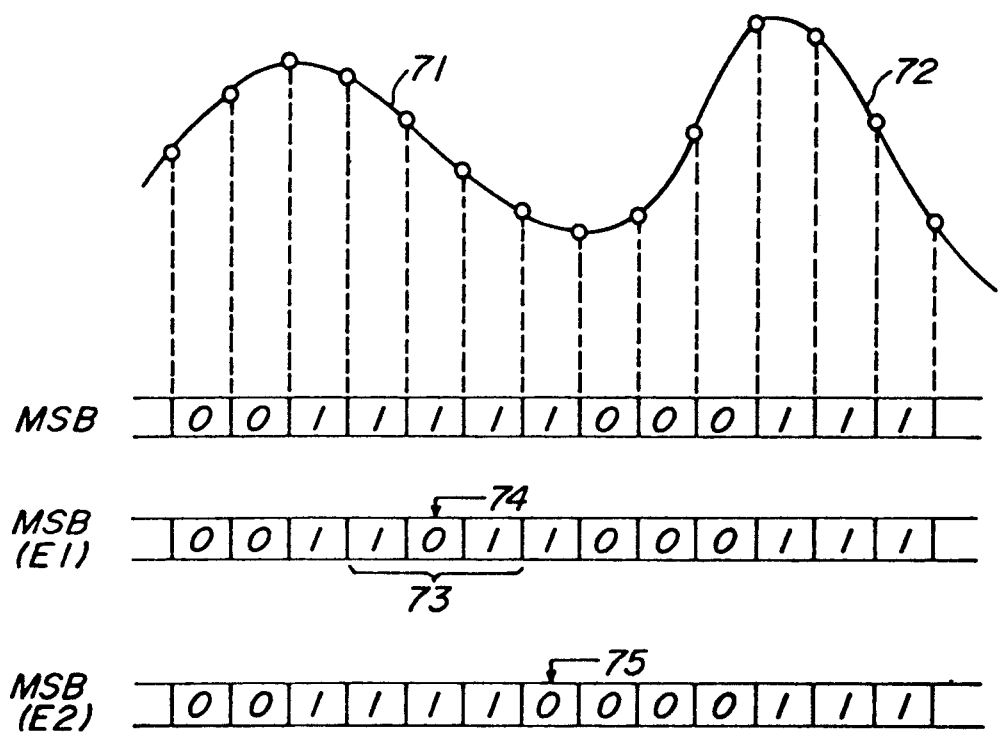
FIG. 6 is a diagram showing the principle of error correction according to the present invention.

(C6) Next, for the better understanding of the feature of the invention as described in paragraphs (C3), the principle of the featured error correction will be described hereinafter by referring to FIG. 6 provided therefor.

An input analog signal 71 is applied with the differential pulse code modulation (DPCM) at the sampling frequency $f_s$. The most significant bit (MSB) of the obtained DPCM signal indicates the increase or the decrease of the differential value, such as, for instance, "0" indicates the increase, while "1" indicates the decrease. In this situation, when the frequency components contained by the original input analog signal do not exceed $f_s/4$, at least two of the same value "0" or "1" of the MSB should appear continuously. So that, the MSB's of consecutive three coded differential signals are always watched, and, when the consecutive three MSB's which present a pattern "0, 1, 0" or "1, 0, 1" are detected, the centered value "1" or "0" of these patterns is judged to be erroneous and hence these three MSB's presenting the pattern of "0, 1, 0" or "1, 0, 1" is corrected into another pattern "0, 0, 0" or "1, 1, 1", respectively. An example of the erroneous pattern is shown by MSB(E1) in FIG. 6, more particularly, the erroneous pattern 73 of consecutive three MSB's, "1, 0, 1" being corrected into "1, 1, 1" by changing the erroneous bit 74 from "0" to "1". However, the erroneous bit 75 "0" in the erroneous pattern as shown by MSB(E2) in FIG. 6 cannot be detected and hence cannot be corrected.

Figure 7:
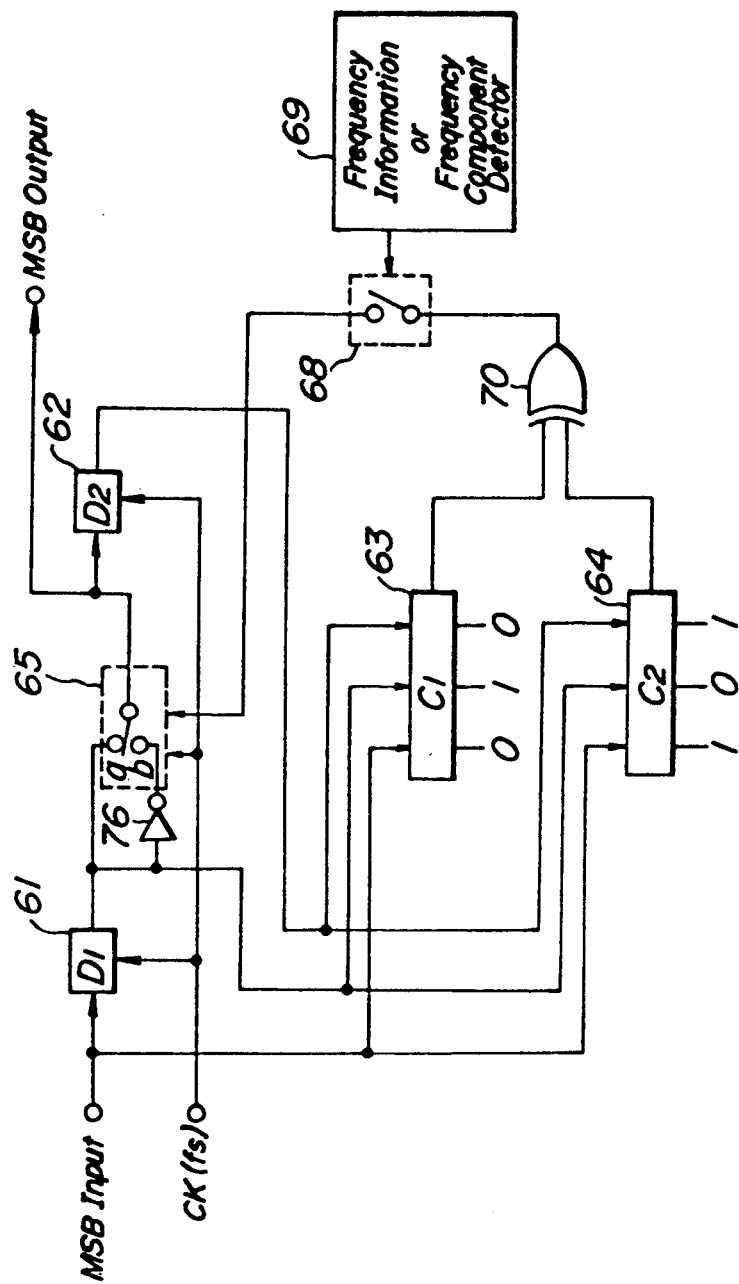
FIG. 7 is a block diagram showing a fundamental structure of an error correction circuit according to the present invention.

FIG. 7 shows a theoretical structure of the aforesaid error correction circuit. In this circuit, the consecutive three MSB's successively picked up through one sample delays ($D_1$)61 and ($D_2$)62 are simultaneously supplied to two comparators ($C_1$)63 and ($C_2$)64. In this connection, a changeover switch 65 inserted together with an inverter 76 between the delays ($D_1$)61 and ($D_2$)62 are usually set up on a side "a", while, only when the fact that the original signal does not contain frequency component exceeding $f_s/4$ is detected through a frequency information or frequency component detector 69 as described later, another switch 68 is closed, and hence, when the aforesaid erroneous patterns of the consecutive three MSB's "0, 1, 0" and/or "1, 0, 1" are detected through the comparators ($C_1$)63 and/or ($C_2$)64, the switch 65 is immediately changed over on another side "b", so as to invert the second bit of the erroneous pattern into a corrected bit through the inverter 76. Immediately thereafter, the switch 65 is changed over on the side "a" again by the consecutive sampling clock, so as to maintain the usual state of erroneous pattern detection.

In addition, a method of efficiently and accurately operate the aforesaid error correction circuit in combination, for instance, with a usual code transmission system will be described hereinafter.

First, in case that the error correction of this kind is effected by utilizing the frequency information of the original analog signal, on the sending side, the DPCM signal is divided into plural blocks, each of which has a certain time duration, for instance, 1 msec per block, and in each of those blocks, the frequency information consisting of one bit for controlling, which indicates whether the frequency component exceeding $f_s/4$ exists, that is, the erroneous pattern "0, 1, 0" and/or "1, 0, 1" exist, in the block concerned or not, is added to the DPCM signal. For example, "1" of this controlling one bit indicates, the existence of frequency components exceeding $f_s/4$, while "0" thereof indicates the non-existence of the same, and, only when "0" thereof is detected through the aforesaid detector 69 provided on the receiving end, the aforesaid switch 68 is closed by the output of the detector 69, so as to effect the error correction of this kind.

Next, in case that the error correction of this kind is effected without the utilization of the frequency information of the original analog signal, the data protection in the usual digital recording or transmission is customarily effected by adding error correction codes to the data concerned, so that the error correction circuit of this kind is operated in combination with these error correction codes. That is, in a state that any code error is not caused, for preventing the erroneous code correction of this kind in case that the original analog signal contains frequency components exceeding $f_s/4$, the error correction circuit of this kind is made to be inoperative, while, only when the code error is detected, the error correction circuit of this kind is made to be operative.

Furthermore, in case that the error rate exceeds a predetermined value, the faculty of double error correction, which is attained when the error detection according to the error correction code is missed, can be achieved by operating the error correction circuit of this kind.

On the other hand, in case the original analog signal contains frequency components exceeding $f_s/4$, it is feared that, when a correct pattern "1, 0, 1" or "0, 1, 0" of consecutive three MSB's is occasionally obtained, this correct pattern is erroneously detected as the erroneous pattern on the receiving side. For preventing this erroneous detection, it is preferable that, on the receiving side, the original analog signal is discriminated to originally contain frequency components exceeding $f_s/4$ and hence the error correction of this kind is stopped. For example, in case that erroneous patterns are successively detected on the receiving side, namely, that the patterns "A, B, C" and "B, C, D" among consecutive four MSB's are erroneous respectively, the probability of the aforesaid erroneous detection can be reduced by stopping the error correction of this kind under the decision such as the possibility that the original analog signal contains frequency components exceeding $f_s/4$ is high.

A concrete circuitry for realizing the error correction circuit of this kind is shown in FIG. 8. In this circuitry, even when the erroneous pattern is detected through the comparators ($C_1$)63 and ($C_2$)64, the error correction of this kind is not immediately effected, but consecutive two MSB's picked up through an additional one sample delay ($D_3$)66 is observed. As a result, when an erroneous pattern which does not succeeded twice is detected, the error correction of this kind is effected by the same switching operation as described with regard to the circuitry as shown in FIG. 7. On the other hand, when erroneous patterns are successively twice detected, a "0" output is derived from a NAND gate 77 and hence the error correction of this kind is successively twice stopped through the combination of two AND gates 78 and 79 and a one sample delay ($D_4$)67.

(D6) Next, with respect to an embodiment as featured as described in paragraphs ($D_3$), the present invention will be further descried.

First, a code transmission system effected by converting a binary code (0, 1) into a tertiary code (L1, L2, L3) will be described hereinafter.

The code conversion from 3 bits of the binary code into 2 symbols of the tertiary code is preferable for reducing the affection of code error caused by bit error and further for simplifying the coding. In this code conversion, eight ($=2^3$) ways of the combination of three bits of the binary code are allotted through nine ($=3^2$) ways of the combination of 2 symbols of the tertiary code. Accordingly, the number of bit errors caused in the decoded binary code, which is based on the error of any one bit, is minimally one, while maximally three.

Generally, when it is assumed that a certain bit of an original code is mistaken for any one bit, for instance, jth bit of another code, which is apart from the original bit by qj bits and that the probability, that is, the code error rate in case that the original bit is mistaken for jth bit is assumed to be pj, the average eb of the number of bit errors caused by once code error, that is, the bit error rate is defined as follows.

$$eb = \Sigma pjqj$$

This bit error rate eb is generally controlled by the code error rate pj between the most possible erroneous combinations of codes. So that, for minimizing the bit error rate, it is preferable that the original code is combined with the code in which the code error is the most probably caused, so as to minimize the code error rate pj thereof.

For attaining the above, according to the present invention, a Gray code is allotted to the code to be combined with.

Figure 9A:
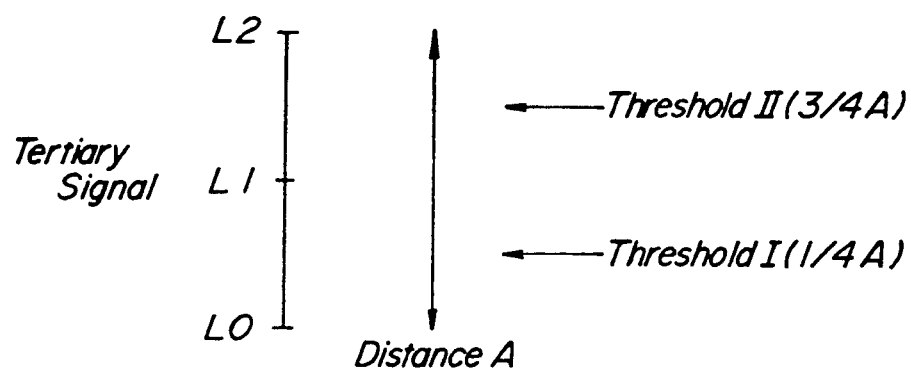
FIGS. 9a and 9b are diagrams showing the fundamental constitutions of a tertiary code respectively.
Figure 9B:
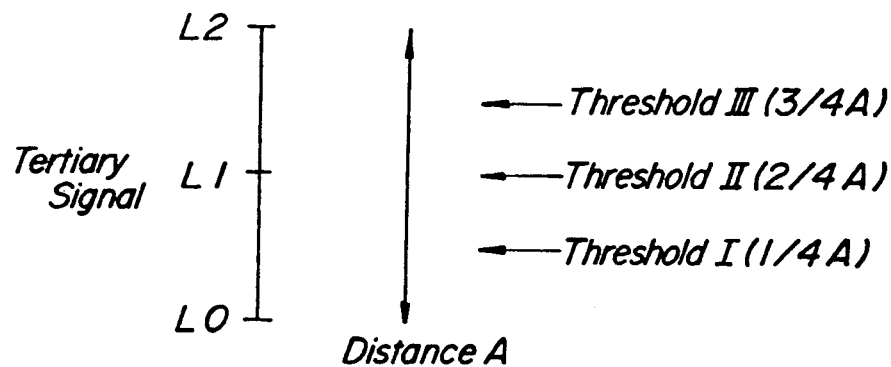

FIGS. 9a and 9b show examples of one symbol of the tertiary code, which is arranged such as the combination of (L1, L1) is not allotted to the original code, so as to avoid the symbol L1 which has the highest possibility of code error in the tertiary code.

FIG. 10 shows an example of the code consisting of a matrix of three rows multiplexed by three columns such as the first symbol of the tertiary code is arranged in the row, while the second symbol thereof is arranged in the column.

According to the above allotment of three bits of the binary code, when the code error is caused on the one symbol thereof having the highest possibility and the shortest distance, the bit error of one bit, two bits or three bits will be caused.

FIG. 11 shows an example of the Gray code in which the bit error of only one bit is caused, even when the code error is caused on the one symbol thereof having the highest possibility and the shortest distance as described above.

In addition, when three bits of the binary code is decoded from 2 symbols of the tertiary code, the threshold levels for discriminating the tertiary code are 1/4A and 3/4A under the condition that the distance from L0 to L2 of the tertiary code as shown in FIG. 9a.

For example, true two symbols (L0, L0) of the tertiary code become (L1, L0) in case the first symbol is in error, while those symbols become (L0, L1) in case the second symbol is in error, and hence, the decoded binary code becomes (1, 0, 0) and (0, 0, 1) respectively from the true binary code (0, 0, 0) in these cases, in each of these cases the erroneous bit being "1".

Furthermore, when the error of one symbol of the tertiary code, which is infrequently caused because of the long distance, is caused, the two bits become erroneous under the similar consideration.

However, the code error rate is usually under the control of the most frequent error, so that it is enough to consider only the error of one symbol having the shortest distance.

In the conventional decoder as showing FIG. 12, two threshold comparators 80 and 81 are provided, the outputs thereof being supplied to lower order address inputs A2, A3 of a read-only memory 82 as a first symbol discrimination outputs, as well as to higher order address inputs A0, A1 of the same as a second symbol discrimination outputs. In other words, the matrix of three rows and three columns as shown in FIG. 11 is made to correspond to the address inputs of the read-only memory 82, so as to memory three bits of the binary code decoded therefrom in this memory 82.

In this connection, even if three bits of any binary code are allotted to two symbols of the tertiary code to which symbols the binary code concerned is not allotted, the total sum of erroneous bits caused by the code error of the one symbol having the short distances of four ways becomes six bits.

Accordingly, FIG. 13 shows an example of the tertiary code discrimination thresholds of 1/4A, 1/2A and 3/4A according to the present invention, in which a new threshold III is provided midway between the conventional thresholds I and II. In these thresholds, a matrix of four rows and four columns is formed by allotting the first symbol of the tertiary code to the rows, as well as allotting the record symbol thereof to the columns, with the borders situated by the thresholds.

As to symbols (L1, L1) to which the binary code concerned is not allotted, that is, the matrix of two rows and two columns with the border situated by the thresholds two groups of three bits of the binary code being the same as two groups of symbols on the periphery of the matrix of four rows and four columns, which surrounds the matrix concerned, or, two groups of three bits of the binary code, which are formed by combining the same bits being common with the above three bits of the tertiary code and the remaining two bits thereof, are allotted.

FIG. 14 shows an example of the allotment of four ways of the aforesaid matrix of two rows and two columns, while FIG. 15 shows an example of the allotment of 3 bits of the binary code which are the same as the periphery of the matrix of four rows and four columns.

As is apparent from the above, when the symbol (L1, L1) are in error, if the three bits of the binary code as shown in FIG. 15 are allotted with the border situated by the threshold II, the number of erroneous bits caused by the code error of the one bit having short distances of four ways becomes two or zero, so that the total sum of erroneous bits is four.

On the other hand, FIG. 13 shows the example of the two groups of three bits of the binary code, which consists of the combination of the same bits in common and the remaining two bits being allotted. According to this example, when the symbol (L1, L1) are in error, if the three bits of the binary code as shown in FIG. 13 are allotted with the border situated by the threshold II, the number of erroneous bits caused by the code error of the one bit having short distances of four ways becomes one, so that the total sum of erroneous bits is four.

According to the above allotment, the number of the bit error caused by the code error of all of the one bit having short distances becomes 1, so that the most preferable decoding can be attained by the dispersion of the error.

Thus, according to the code decoding of the present invention, the further lower bit error rate can be attained as for the same code error rate.

FIG. 16 shows an example of a decoder according to the present invention. In this decoder, three threshold comparators 83, 84 and 85 are provided, the output thereof being supplied to lower order address inputs of a read-only memory 86 as the first symbol discrimination output, as well as supplied to higher order address inputs of the same as the second symbol discrimination output. In other words, the matrix of three rows and three columns as shown in FIG. 13 is made to correspond to the address inputs of the read-only memory 86, so as to memorize three bits of the decoded binary code therein.

As is apparent from the above descriptions, according to the present invention, the following evident effects can be obtained.

(A7) In the conventional differential coding system, the higher the frequency of the input signal is raised, the narrower the dynamic range thereof becomes. Accordingly, it is frequently caused that the transmission efficiency of the input signal frequency components of which are concentrated in the higher frequency range. When the separated differential code transmission system of the present invention as featured as described in paragraphs (A3) is applied onto the input signal of this kind, the coding efficiency is improved, as well as the dynamic range in the higher frequency range is secured in exchange for the dynamic range in the middle frequency range.

Moreover, as for the input signal in which respective components in the middle and the higher frequency ranges are appropriately intermixed, the coding efficiency is improved at the most by jointly using the above separated differential code transmission system and the conventional differential coding system.

Furthermore, the coding efficiency is further improved by applying the aforesaid two kinds of near instantaneous compression differential coding systems on the conventional coding system of this kind.

(B7) Although, in the conventional differential coding system, no more than two bit improvement of the efficiency can be expected by the effect of the concentration of the signal level population, according to the present invention, it is possible to realize the code transmission of eight bits per one sample with the quality corresponding to that of the linear PCM of fourteen bits. Moreover, although there is no precedent for this, it is also possible according to the present invention to correct the error of signals in the lower frequency range which is caused by the compression and the expansion of differential codes and hence to suppress the signal distortion by appropriately controlling of the differential output of the comparison between the original signal and the locally decoded output on the sending side.

In addition, according to the coding system as featured as described in paragraph (B3), the improvement of the transmission efficiency and the signal quality in the differential code transmission system as one of high efficiency coding systems can be realized.

(C7) According to the application of the present invention as featured as described in paragraphs (C3), the error of the MSB of differential code, which has the most important effect upon the received or reproduced code, can be corrected with a remarkable effect, for instance, only by sending a control signal of one bit per one block of the code from the sending side to the receiving or reproducing side or by providing an appropriate frequency component detection means on the receiving side, that is, a extensive effect can be obtained through a simple circuitry.

(D7) According to the application of the invention as featured as described in paragraphs (D3), the reduction of the bit error rate in the code transmission can be attained without any requirement of the spread of the transmission frequency band.

What is claimed is:

1. A differential coding system, comprising:
    digitizer means for sampling an input analog signal to provide a digital signal comprising a plurality of samples of said input analog signal;
    means for separating said samples into a first group of even samples and a second group of odd samples; and
    means for providing a coded differential signal comprising successive differences of samples of said first group and said second group respectively,
    whereby said coded differential signal is transmitted or recorded.

2. A differential coding system, comprising:
    (a) a first differential coding means including a digitizer means for sampling an input analog signal to provide a digital signal comprising a plurality of samples of said input analog signal, means for separating said samples into a first group of even samples and a second group of odd samples, and means for providing a first coded differential signal comprising successive differences of samples of said first group and said second group respectively;
    (b) a second differential coding means including means for providing a second coded differential signal comprising successive differences of said plurality of samples without said samples being divided into said first group and said second group;
    (c) means for detecting a predetermined output of higher frequency components of said input analog signal; and
    (d) means for switching between said first coded differential signal and said second coded differential signal in response to said predetermined detected output of higher frequency components of said input analog signal, to selectively improve coding efficiency of said first coded differential signal and said second coded differential signal.

3. A system as in claim 1, further comprising means for substantially instantaneously compressing said coded differential signal.

4. A system as in claim 2, further comprising means for substantially instantaneously compressing said first coded differential signal and said second coded differential signal.

5. A differential coding system, comprising;
    (a) digitizer means for sampling an input analog signal to provide a digital signal comprising a plurality of samples of said input analog signal;
    (b) first means for providing first signals representing successive differences between adjacent ones of said samples;
    (c) means for providing range signals serving as compression control signals comprising (i) a range detector for providing maximum value signals respectively indicating a maximum value of said first signals representing successive differences for each of predetermined sections in which said successive samples are divided and (ii) a range signal generator for providing range signals indicating a range compression factor respectively for each of said predetermined sections based upon said maximum value signals;

(d) delay means for delaying said digital signal comprising said plurality of samples of said input analog signal to provide a delayed digital input signal;

(e) second means for providing second signals representing successive differences between adjacent ones of samples in said delayed digital input signal;

(f) means for substantially instantaneously compressing said second signals representing said successive differences comprising a range compressor controlled by said range signals to output a compressed output signal of said delayed digital signal;

(g) local decoder means for restoring said delayed digital signal from said compressed output signal; and (h) means for comparing said restored digital signal with said delayed digital signal and providing a comparison result output signal; and wherein (i) said second means comprises a subtractor having a gain control input receiving said comparison result output signal, whereby a gain of said subtractor is feedback-controlled by said comparison result output signal to enable errors in said successive difference signals between adjacent ones of samples in said delayed digital input signal to be corrected.

6. A differential coding system, comprising:

(a) a digitizer means for sampling an input analog signal at a frequency $f_s$ to provide a digital signal comprising a plurality of samples of said input analog signal;

(b) a differential pulse code modulation means for providing a coded differential signal of said digital signal comprising most significant bits providing an indication of increase or decrease of signal level between adjacent ones of said samples whereby a 0 indicates an increase of said signal level and a 1 indicates a decrease of said signal level;

(c) a frequency detection means for detecting whether said input analog signal has a signal component of a frequency greater than $f_s/4$; and (d) correction means for correcting at least one of a pattern 1,0,1 and a pattern 0,1,0 of three successive most significant bits of said coded differential signal, such that said pattern 1,0,1 is corrected to 1,1,1 and said pattern 0,1,0 is corrected to 0,0,0 in response to an indication by said frequency detection means that said input analog signal has no signal component of a frequency greater than $f_s/4$.

* * * * *